(12) United States Patent
Park

(10) Patent No.: US 12,190,789 B2
(45) Date of Patent: Jan. 7, 2025

(54) DISPLAY DEVICE

(71) Applicant: LG Display Co., Ltd., Seoul (KR)

(72) Inventor: Sunghee Park, Paju-si (KR)

(73) Assignee: LG Display Co., Ltd., Seoul (KR)

(*) Notice: Subject to any disclaimer, the term of this patent is extended or adjusted under 35 U.S.C. 154(b) by 473 days.

(21) Appl. No.: 17/543,562

(22) Filed: Dec. 6, 2021

(65) Prior Publication Data

US 2022/0199707 A1 Jun. 23, 2022

(30) Foreign Application Priority Data

Dec. 22, 2020 (KR) .......................... 10-2020-0181013

(51) Int. Cl.
*G09G 3/32* (2016.01)
*G09G 3/3233* (2016.01)
*H10K 59/131* (2023.01)

(52) U.S. Cl.
CPC ............. *G09G 3/32* (2013.01); *G09G 3/3233* (2013.01); *H10K 59/131* (2023.02); *G09G 2300/0426* (2013.01); *G09G 2300/0452* (2013.01)

(58) Field of Classification Search
CPC ................... G09G 3/32; G09G 3/3233; G09G 2300/0426; G09G 2300/0452; H10K 59/131; H10K 59/121; H10K 59/351; H10K 59/353; H10K 59/12; H10K 59/38
See application file for complete search history.

(56) References Cited

U.S. PATENT DOCUMENTS

| 9,794,549 | B2 | 10/2017 | Wei | |
| 2016/0291758 | A1* | 10/2016 | Du | G06F 3/04164 |
| 2016/0321982 | A1* | 11/2016 | Lee | G09G 3/3233 |
| 2020/0279531 | A1* | 9/2020 | Yang | H10K 59/131 |
| 2021/0225292 | A1* | 7/2021 | Park | H10K 59/124 |

FOREIGN PATENT DOCUMENTS

| KR | 10-1945428 B1 | 1/2019 |
| KR | 10-2019-0012136 A | 2/2019 |
| WO | 2017/222298 A1 | 12/2017 |

* cited by examiner

*Primary Examiner* — Premal R Patel
(74) *Attorney, Agent, or Firm* — Seed IP Law Group LLP

(57) ABSTRACT

A display device includes: a pixel part in which sub-pixels are disposed, and at least one transparent part disposed in an area adjacent to the pixel part. The at least one transparent part passes external light therethrough. The pixel part may include: first, second, third and fourth extension parts extending in directions different from each other and including wires; and first, second, third and fourth circuit parts. Each of the first, second, third and fourth circuit parts is disposed between adjacent pairs of the first, second, third and fourth extension parts and includes circuit elements of a respective sub-pixel of the sub-pixels.

22 Claims, 10 Drawing Sheets

DISPLAY DEVICE

CROSS REFERENCE TO RELATED APPLICATION

The present application claims priority to Korean Patent Application No. 10-2020-0181013, filed Dec. 22, 2020, the entire contents of which is incorporated herein for all purposes by this reference.

BACKGROUND

Technical Field

The present disclosure relates to a display device.

Description of the Related Art

An organic light emitting display device displays an image by using an organic light emitting diode that generates light by recombination of electrons and holes. The organic light emitting display device is a self-luminous display device and has a fast response speed and is driven with low power consumption, and thus is spotlighted as a next-generation display.

The organic light emitting display device may be configured as a transparent display device by making a transistor or a light emitting element located inside the display device transparent or by separating a circuit part from a transparent part. A normal transparent display device has a rectangular transparent part and has a transparency of about 40%.

BRIEF SUMMARY

The inventors have realized that diffraction occurs at edges of the rectangular transparent part due to width and height thereof having different lengths, respectively. Such diffraction causes haze, which reduces the sharpness of the display device. Embodiments of the present disclosure include a display device in which a transparent part has a shape that reduces diffraction and haze.

In order to achieve the above technical benefits, a display device according to an embodiment of the present disclosure includes: a pixel part having sub-pixels disposed therein, and at least one transparent part disposed in an area adjacent to the pixel part. The at least one transparent part passes external light therethrough. The pixel part may include: first, second, third and fourth (or, "first to fourth") extension parts extending in directions different from each other and comprising wires; and first, second, third and fourth (or, "first to fourth") circuit parts. Each of the circuit parts is disposed between an adjacent pair of the first, second, third and fourth extension parts, and includes circuit elements of a respective sub-pixel of the sub-pixels.

The first, second, third and fourth extension parts may have shapes symmetrical to adjacent extension parts, respectively, relative to a first axis and a second axis intersecting the first axis. The first, second, third and fourth circuit parts may have shapes symmetrical to adjacent circuit parts, respectively, relative to the first axis and the second axis.

Each of the first, second, third and fourth circuit parts may be configured to have a triangular shape including: a first side being in contact with an extension part adjacent to a first side thereof; a second side being in contact with an extension part adjacent to a second side thereof; and a third side being in contact with the transparent part.

A length of the third side may be longer than a length of a fourth side located at each of the first, second, third and fourth extension parts and being in contact with the at least one transparent part.

Distances between each of the first, second, third and fourth extension parts and a center of a transparent part adjacent thereto may be substantially the same.

The at least one transparent part may be surrounded in part by the third side of the circuit part and extension parts adjacent to the circuit part.

The wires may include: at least one first power line configured to apply a high potential drive voltage to the sub-pixels, and at least one second power line configured to apply a low potential drive voltage to the sub-pixels. Each of the first power line and the second power line comprises a first pattern extending along a first axis via each of the first extension part and the third extension part, and at least one of the first power line and the second power line comprises a second pattern extending along a second axis overlapping the first axis via each of the second extension part and the fourth extension part. The high potential drive voltage may be greater than the low potential drive voltage.

The wires may include: a first power line configured to apply a high potential drive voltage to the sub-pixels, and a second power line configured to apply a low potential drive voltage to the sub-pixels. Each of the first power line and the second power line may include the second pattern extending along the second axis overlapping the first axis via each of the second extension part and the fourth extension part, and at least one of the first power line and the second power line may include the first pattern extending along the first axis overlapping the second axis via each of the first extension part and the third extension part.

Each of the sub-pixels may include a light emitting part disposed at a region of overlap between a respective circuit part and a respective adjacent pair of extension parts. The light emitting part may include a light emitting element.

The light emitting part may be configured to have a three-sided shape having one curved side in contact with the at least one transparent part.

The at least one transparent part may be surrounded in part by the curved side of the light emitting part.

The light emitting part may include a first light emitting part and a second light emitting part. The first light emitting part overlaps a first portion of a circuit part corresponding to the light emitting part and an extension part adjacent to a first side of the corresponding circuit part. The second light emitting part overlaps a second portion of the circuit part and an extension part adjacent to a second side of the circuit part.

The pixel part may include: a substrate on which red, green, blue and white sub-pixels are disposed; color filters disposed corresponding to a respective light emitting part of each of the red, green, and blue sub-pixels; and a black matrix disposed between adjacent ones of the color filters. The black matrix may not be disposed on the white sub-pixel.

The display device according to one embodiment includes: a display panel having unit pixels disposed thereon. Each of the unit pixels includes: a pixel part and at least one transparent part. The pixel part has sub-pixels disposed thereon. The at least one transparent part is disposed in an area adjacent to the pixel part and passes external light therethrough. The pixel part may include: first to fourth extension parts extending in directions different from each other and comprising wires; and first to fourth circuit parts. Each of the circuit parts is disposed between a respective adjacent pair of the first to fourth extension parts, and comprises respective circuit elements of each of the sub-pixels.

Each of the first to fourth circuit parts may be configured to have a three sided shape. The three sided shape may include: a first side in contact with one of the first to fourth extension parts adjacent thereto; a second side in contact with another of the first to fourth extension part adjacent thereto; and a third side in contact with the transparent part. A length of the third side may be longer than a length of a fourth side located at each of the first to fourth extension parts and in contact with the a respective transparent part of the at least one transparent part.

Distances between each of the first to fourth extension parts and the center of a transparent part adjacent thereto may be substantially the same.

The at least one transparent part may be surrounded by four sub-pixels belonging to different unit pixels, respectively, and may have an edge corresponding to third sides of respective circuit part of the four sub-pixels and respective extension parts adjacent to the circuit parts.

The at least one transparent part may have an overall regular octagonal shape.

Each of the sub-pixels may include at least one light emitting part disposed at a region. The region may be a region of overlap between a circuit part and an extension part. The at least one light emitting part may include a light emitting element.

The at least one transparent part may be surrounded by four sub-pixels belonging to different unit pixels, respectively, and may have an edge corresponding to the curved side of respective light emitting parts of the four sub-pixels. The at least one transparent part may have an overall circular shape.

In the display device according to the embodiments, a substantially regular octagonal or circular transparent part is provided, so diffraction and haze at the edge of the transparent part can be reduced. In addition, the display device according to the embodiments has the same definition as the definition of a transparent display device having a conventional rectangular transparent part and has improved sharpness, thereby improving visibility of the background of the rear surface of the display device.

In the display device according to the embodiments, a black matrix arranged on a white sub-pixel is removed, thereby further improving sharpness.

BRIEF DESCRIPTION OF THE SEVERAL VIEWS OF THE DRAWINGS

The above and other technical benefits, features, and other advantages of the present disclosure will be more clearly understood from the following detailed description when taken in conjunction with the accompanying drawings, in which.

DETAILED DESCRIPTION

Figure 1:
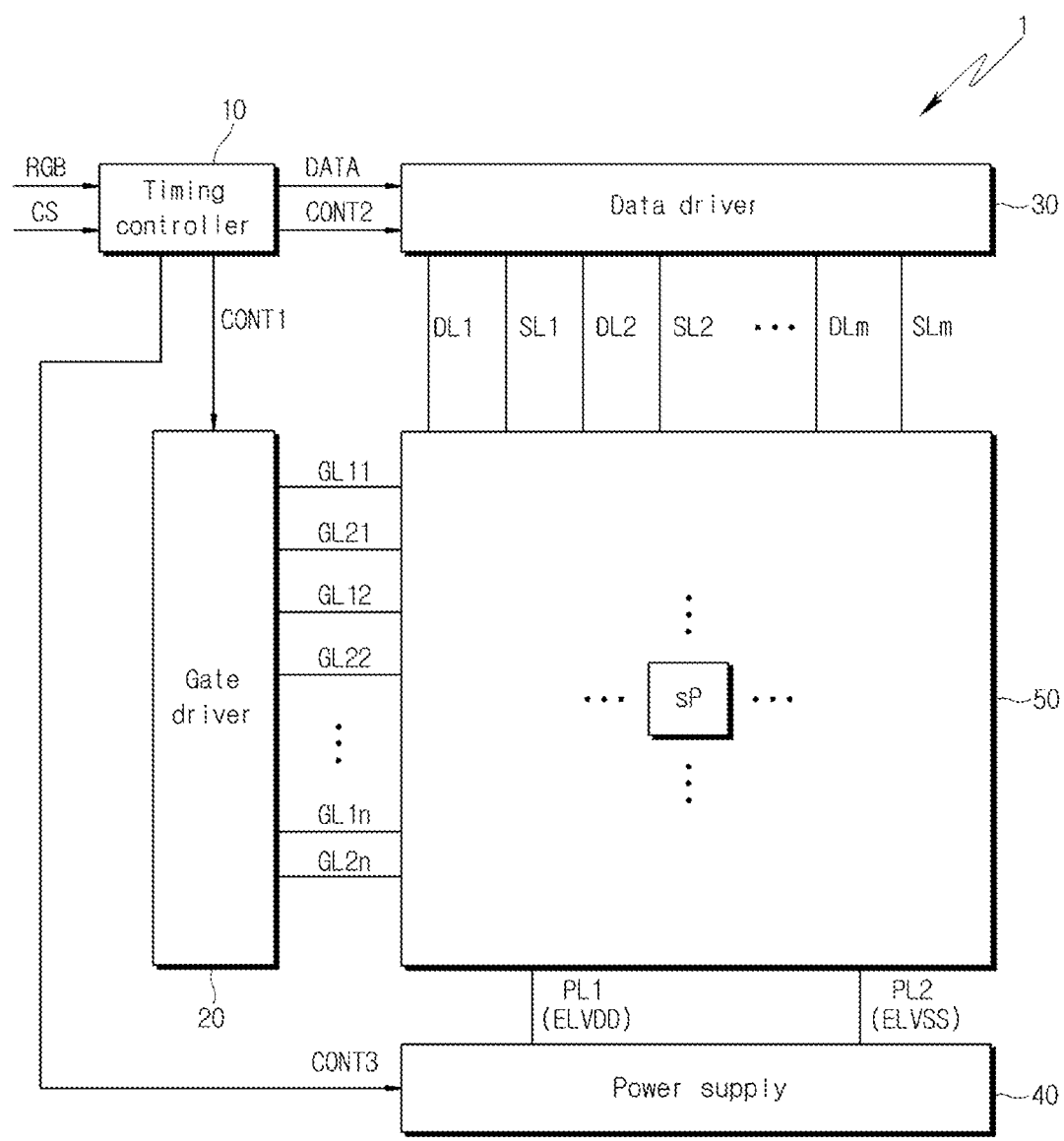
FIG. 1 is a block diagram illustrating the configuration of a display device according to an embodiment.

Hereinafter, embodiments of the present disclosure will be described with reference to the accompanying drawings. In this specification, when a component (or an area, layer, or portion, etc.) is referred to as being "on," "connected to," or "coupled to" another component, it means that the component can be directly connected/coupled to other components or that a third component can be disposed therebetween.

Like reference numerals refer to like elements. In addition, in the drawings, the thicknesses, proportions, and dimensions of components are exaggerated for effective description of technical content. "And/or" includes any combination of one or more that the associated configurations may define.

Terms such as first and second, etc., may be used to describe various elements, but the elements are not limited to the terms. The above terms are used only for the purpose of distinguishing one component from another component. For example, without departing from the scope of the present disclosure, the first component may be referred to as the second component. Similarly, the second component may also be referred to as the first component. A singular expression includes a plural expression unless the context clearly dictates otherwise.

Terms such as "under," "at a lower side," "on," "at an upper side" are used to describe the relationship of the components shown in the drawings. The above terms have relative concepts and are described with reference to directions indicated in the drawings.

Terms such as "comprise" or "have" are intended to designate that a feature, number, step, operation, component, or combination thereof described in the specification is present, and it should be understood that the terms do not preclude the possibility of addition or existence of one or more other features or numbers, steps, operations, components, or combinations thereof.

FIG. 1 is a block diagram illustrating the configuration of a display device according to an embodiment.

Referring to FIG. 1, the display device 1 includes a timing controller 10, a gate driver 20, a data driver 30, a power supplier 40, and a display panel 50.

The timing controller 10 can receive an image signal RGB and a control signal CS from the outside. The image signal RGB may include a plurality of gradation data. The control signal CS, for example, may include a horizontal sync signal, a vertical sync signal, and a main clock signal.

The timing controller 10 processes the image signal RGB and the control signal CS such that the image signal RGB and the control signal CS suit the operation condition of the display panel 50 and can generate and output image data DATA, a gate drive control signal CONT1, a data drive control signal CONT2, and a power supply control signal CONT3.

The gate driver 20 can be coupled with sub-pixels sP of the display panel 50 through a plurality of first gate lines GL11 to GL1n. The gate driver 20 can generate gate signals on the basis of the gate drive control signal CONT1 output from the timing controller 10. The gate driver 20 can provide the generated gate signals to the sub-pixels sP through the plurality of first gate lines GL11 to GL1n.

In various embodiments, the gate driver 20 may further be coupled with the sub-pixels sP of the display panel 50 through a plurality of second gate lines GL21 to GL2n. The gate driver 20 can provide a sensing signal to the sub-pixels sP through the plurality of second gate lines GL21 to GL2n. The sensing signal may be provided to the sub-pixels so as to measure the characteristics of a drive transistor and/or a light emitting element provided inside the sub-pixels sP.

The data driver 30 may be coupled with the sub-pixels sP of the display panel 50 through a plurality of data lines DL1 to DLm. The data driver 30 can generate data signals on the basis of the image data DATA and the data drive control signal CONT2 output from the timing controller 10. The data driver 30 can provide the generated data signals to the sub-pixels sP through the plurality of data lines DL1 to DLm.

In various embodiments, the data driver 30 may further be coupled with the sub-pixels sP of the display panel 50 through the plurality of sensing lines SL1 to SLm (or, reference lines). The data driver 30 may provide a reference voltage (or, a sensing voltage or an initialized voltage) to the sub-pixels sP through the plurality of sensing lines SL1 to SLm, or may detect the state of each of the sub-pixels sP on the basis of an electrical signal fed back from the sub-pixel sP.

The power supplier 40 may be coupled with the sub-pixels sP of the display panel 50 through a plurality of power lines PL1 and PL2. The power supplier 40 may generate a drive voltage to be provided to the display panel 50 on the basis of the power supply control signal CONT3. For example, the drive voltage may include a high potential drive voltage ELVDD and a low potential drive voltage ELVSS. The power supplier 40 may provide the generated drive voltages ELVDD and ELVSS to the sub-pixels sP through the power lines PL1 and PL2 corresponding to the power supplier 40.

A plurality of sub-pixels sP is arranged in the display panel 50. For example, the sub-pixels sP may be arranged in a matrix form on the display panel 50.

Each of the sub-pixels sP may be electrically coupled to the gate line and the data line which correspond thereto. Such a sub-pixel sP can emit light with luminance corresponding to gate signals and data signals supplied through the first gate lines GL11 to GL1n and the data lines DL1 to DLm, respectively.

The sub-pixels sP may display any one of the first to third colors. In the embodiment, each of the sub-pixels sP may display any one of red, green, and blue colors. In another embodiment, each of the sub-pixels sP may display any one of cyan, magenta, and yellow colors. In various embodiments, the sub-pixels sP may be configured to display any one of four or more colors. For example, each of the sub-pixels sP may display any one of red, green, blue, and white colors.

The timing controller 10, the gate driver 20, the data driver 30, and the power supplier 40 may be configured as individual integrated circuits (IC), respectively, or may be configured as integrated circuits having at least some of the timing controller 10, the gate driver 20, the data driver 30, and the power supplier 40 integrated with each other. For example, at least one of the data driver 30 and the power supplier 40 may be configured as an integrated circuit integrated with the timing controller 10.

In addition, in FIG. 1, the gate driver 20 and the data driver 30 are illustrated as components separate from the display panel 50, but at least one of the gate driver 20 and the data driver 30 may be configured to be integrated with the display panel 50 according to an in panel type. For example, the gate driver 20 may be configured to be integrated with the display panel 50 according to a gate in panel (GIP).

Figure 2:
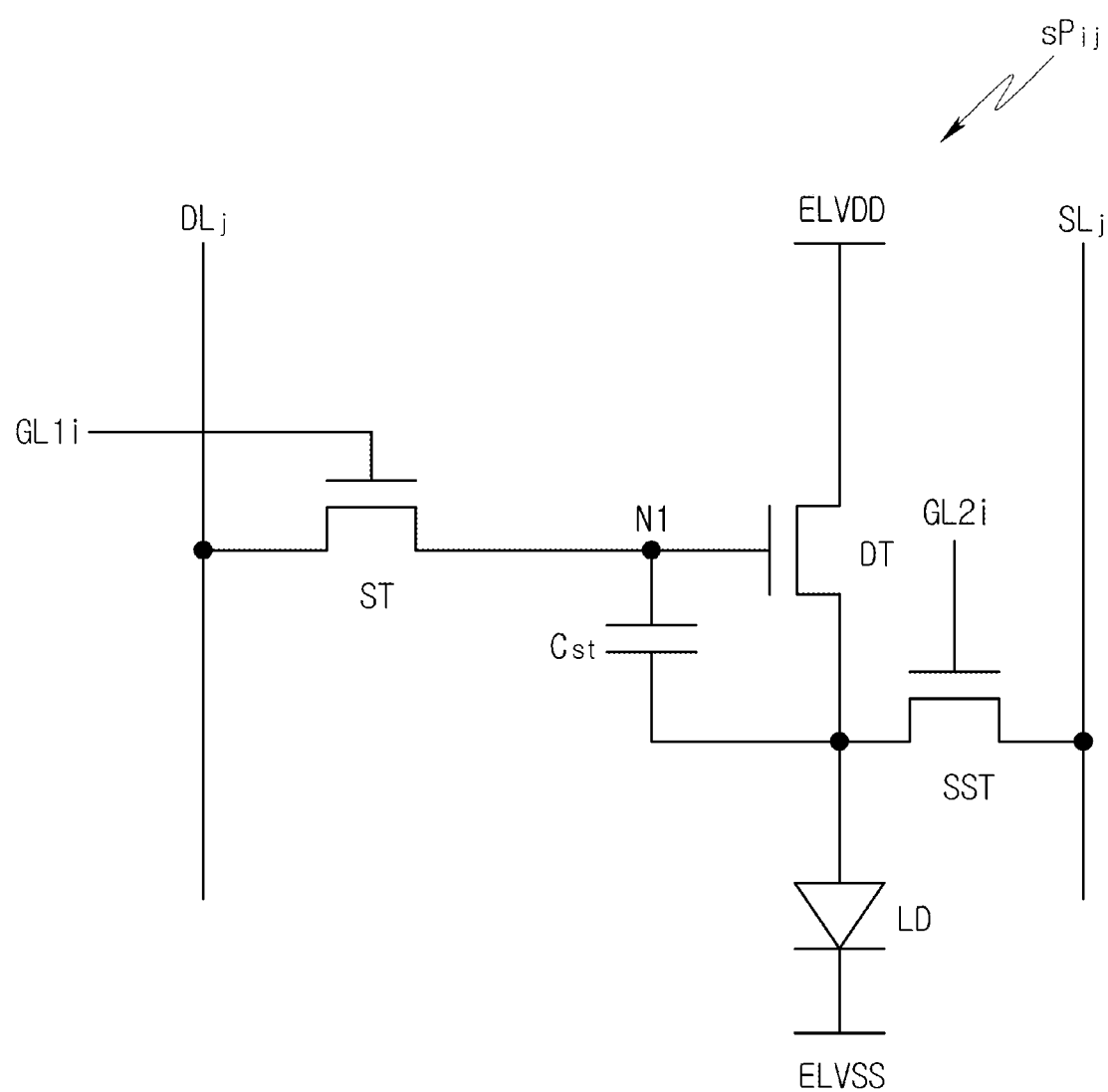
FIG. 2 is a circuit diagram of a sub-pixel illustrated in FIG. 1 according to the embodiment.

FIG. 2 is a circuit diagram of a sub-pixel illustrated in FIG. 1 according to the embodiment. FIG. 2 illustrates the sub-pixel sPij coupled to $i^{th}$ gate lines GL1i and GL2i and a $j^{the}$ data line DLj.

Referring to FIG. 2, the sub-pixel sPij includes a switching transistor ST, a drive transistor DT, a sensing transistor SST, a storage capacitor Cst, and a light emitting element LD.

The first electrode (for example, a drain electrode) of the switching transistor ST is electrically coupled with a $j^{th}$ data line DLj, and the second electrode thereof (for example, a source electrode) is electrically coupled with a first node N1. The gate electrode of the switching transistor ST is electrically coupled with the $i^{th}$ first gate line GL1i. When the gate signal of a gate on level is applied to the ith first gate line GL1i, the switching transistor ST is turned on and transmits a data signal applied to the $j^{th}$ data line DLj to the first node N1.

The first electrode of the storage capacitor Cst is electrically coupled with the first node N1, and the second electrode thereof is coupled to the first electrode of the light emitting element LD. The storage capacitor Cst can charge a voltage corresponding to difference between a voltage applied to the first node N1 and a voltage applied to the first electrode of the light emitting element LD.

The first electrode (for example, a drain electrode) of the drive transistor DT is configured to receive the high potential drive voltage ELVDD, and the second electrode thereof (for example, a source electrode) is electrically coupled to the first electrode (for example, an anode electrode) of the light emitting element LD. The gate electrode of the drive transistor DT is electrically coupled to the first node N1. The drive transistor DT is turned on when the voltage of the gate on level is applied to the gate electrode through the first node N1 and can control the amount of drive current flowing through the light emitting element LD in response to the voltage supplied to the gate electrode.

The first electrode (for example, the drain electrode) of the sensing transistor SST is electrically coupled with a $j^{th}$ sensing line SLj, and the second electrode thereof (for example, the source electrode) is electrically coupled to the first electrode (for example, an anode electrode) of the light emitting element LD. The gate electrode of the sensing transistor SST is electrically coupled to the $i^{th}$ second gate line GL2i. When the sensing signal of the gate on level is applied to the $i^{th}$ second gate line GL2i, the sensing transistor SST is turned on and transmits the reference voltage applied to the $j^{th}$ sensing line SLj to the first electrode of the light emitting element LD.

The light emitting element LD outputs light corresponding to the drive current. The light emitting element LD may be an organic light emitting diode (OLED) or a micro inorganic light emitting diode having a size ranging from micro to nano scale, but is not limited thereto in the embodiment of the present disclosure. Hereinafter, the technical idea of the embodiment of the present disclosure will be described with reference to the embodiment in which the light emitting element LD is configured as the organic light emitting diode.

In the embodiment of the present disclosure, the structure of the sub-pixel sPij is not limited to the structure illustrated in FIG. 2. According to the embodiment, the sub-pixel sPij may further include at least one element so as to compensate for the threshold voltage of the drive transistor DT, or so as to initialize the voltage of the gate electrode of the drive transistor DT and/or the voltage of the first electrode of the light emitting element LD.

In FIG. 2, the switching transistor ST, the drive transistor DT, and the sensing transistor SST are illustrated as an NMOS transistor, but the display device of the present disclosure is not limited thereto. For example, at least some or all of transistors constituting each of the sub-pixels sP may be configured as a PMOS transistor. In various embodiments, each of the switching transistor ST, the drive transistor DT, and the sensing transistor SST may be configured as a low temperature poly silicon (LTPS) thin film transistor, an oxide thin film transistor, or a low temperature polycrystalline oxide (LTPO) thin film transistor.

Figure 3:
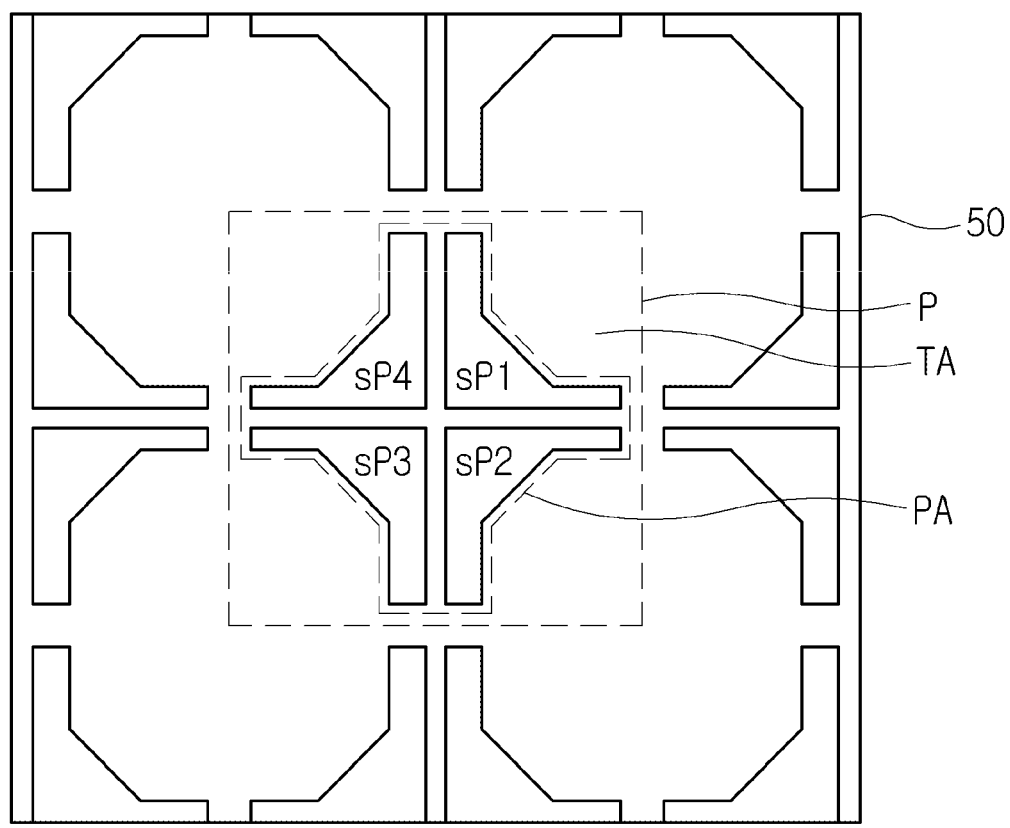
FIG. 3 is a top plan view illustrating a display panel according to the embodiment.

FIG. 3 is a top plan view illustrating a display panel according to the embodiment.

Referring to FIG. 3, one unit pixel P includes a pixel part PA in which the sub-pixels sP1, sP2, sP3, and sP4 displaying colors different from each other are arranged, and a transparent part TA arranged adjacently to the pixel part PA. The pixel part PA and the transparent part TA may be continuously arranged without physical separation.

The number of sub-pixels included in one unit pixel P may be three or four but is not limited thereto.

In one pixel P, the sub-pixels sP1, sP2, sP3, and sP4 are arranged in the pixel part PA. In various embodiments, the pixel part PA may be provided with extension parts extending in different directions, respectively, and having a cross shape (that is, a pinwheel shape). In this embodiment, one sub-pixel may be arranged in one extension part. Hereinafter, the structure of the pixel part PA will be described in more detail with reference to the drawings.

In the embodiment, a circuit part may be disposed between each of adjacent extension parts extending in directions different from each other, wherein the circuit part has a triangular shape having three straight sides. Due to such a shape of the pixel part PA, the transparent part TA may have an overall regular octagonal shape.

The transparent part TA is the remaining part that excludes the pixel part PA and in which the sub-pixels sP1, sP2, sP3, and sP4 are not disposed. The edge of the transparent part TA may be defined by two adjacent extension parts and a triangular circuit part disposed in the overlapping part of the two extension parts. In such an embodiment, the transparent part TA may have an overall regular octagonal shape.

The transparent part TA passes light therethrough and may be formed to be transparent or translucent such that incident light passes through the transparent part. To this end, transparent or translucent materials may be used for layers stacked on the transparent part TA. Through the structure of the unit pixel P including the transparent part TA, the display panel 50 may function as a transparent display device.

The light emitting part in which each of the sub-pixels emits light through the light emitting element LD may be provided in the pixel part PA. In the pixel part PA, the light emitting part may be disposed by overlapping the extension part and the circuit part. In such an embodiment, the light emitting part has one curved side and may have a three-sided shape as a whole. The one side formed to be curved may be in contact with the transparent part TA. In this case, the transparent part TA may be surrounded by four sub-pixels belonging to different unit pixels, respectively. In addition, the transparent part TA may have an edge defined by the light emitting part of each of the sub-pixels. One side of the light emitting part in contact with the transparent part TA is formed to be curved, so the transparent part TA may have an overall circular shape.

Hereinafter, the structure of the pixel part PA and the shape of the transparent part TA will be described in more detail with reference to the accompanying drawings.

Figure 4:
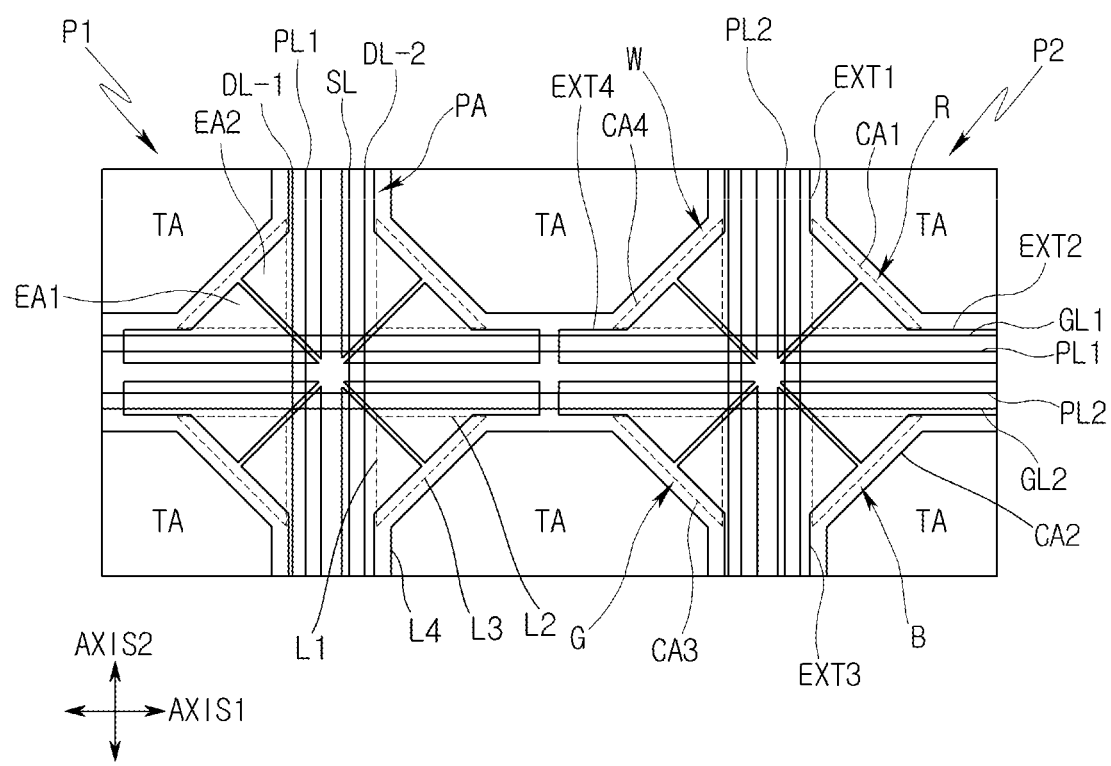
FIG. 4 is a top plan view roughly illustrating the structure of the unit pixel according to the embodiment.

FIG. 4 is a top plan view roughly illustrating the structure of the unit pixel according to the embodiment.

Referring to FIG. 4, under a pixel arrangement structure based on four sub-pixels, the unit pixel P may include the sub-pixels R, G, B, and W that emit red, green, blue, and white lights, respectively. Each of the sub-pixels R, G, B, and W may be arranged at a predetermined position or selected position in the pixel part PA of the unit pixel P. An area in which light is emitted by each of the sub-pixels R, G, B, and W may be defined as the light emitting part EA1 or EA2. In the unit pixel P, the transparent part TA may be formed in an area that excludes the pixel part PA. In the illustrated embodiment, the light emitting part EA1 or EA2 includes two light emitting parts but is not limited thereto in the embodiment of the present disclosure, and one light emitting part or two or more light emitting parts may be provided.

The pixel part PA may have a shape of a cross. That is, the pixel part PA is provided with first to fourth, namely the first, second, third and fourth extension parts EXT1 to EXT4 extending in directions different from each other. Each of first to fourth circuit parts CA1 to CA4 is disposed between each of adjacent extension parts EXT1 to EXT4 extending in directions different from each other. The light emitting parts EA1 and EA2 are disposed in the pixel part PA. Each of the light emitting parts EA1 and EA2 is disposed by overlapping each of the extension parts EXT1 to EXT4 and each of the circuit parts CA1 to CA4 corresponding to the light emitting part.

One sub-pixel R, G, B, or W may be disposed at each of two adjacent extension parts of the extension parts EXT1 to EXT4 and in one circuit part CA1, CA2, CA3, or CA4 disposed therebetween. For example, the red sub-pixel R may be disposed at a portion of the first extension part EXT1 and in the first circuit part CA1 disposed at the overlapping portion of the first extension part EXT1 and the second extension part EXT2 adjacent thereto. The blue sub-pixel B may be disposed at a portion of the second extension part EXT2 and in the second circuit part CA2 disposed at the overlapping portion of the second extension part EXT2 and the third extension part EXT3 adjacent thereto. The green sub-pixel G may be disposed at a portion of the third extension part EXT3 and in the third circuit part CA3 disposed at the overlapping portion of the third extension part EXT3 and the fourth extension part EXT4 adjacent thereto. In addition, the white sub-pixel W may be disposed at a portion of the fourth extension part EXT4 and in the fourth circuit part CA4 disposed at the overlapping portion of the fourth extension part EXT4 and the first extension part EXT1 adjacent thereto.

The wires are disposed in each of the first to fourth extension parts EXT1 to EXT4 so as to apply signals to the circuit elements disposed in each of the circuit parts CA1 to CA4. For example, the wires may include the gate lines GL1 and GL2, the data line DL, the sensing line SL, and the power lines PL1 and PL2 described with reference to FIG. 2.

Circuit elements constituting each of the sub-pixels R, G, B, and W are arranged in each of the first to fourth circuit parts CA1 to CA4. For example, the circuit elements may include the drive transistor DT, the switching transistor ST, the sensing transistor SST, and the storage capacitor Cst described with reference to FIG. 2.

Particularly, in the embodiment of the present disclosure, each of the first to fourth circuit parts CA1 to CA4 is configured to have a triangular shape having three straight sides. In three sides constituting the circuit parts CA1 to CA4, a first side L1 is in contact with a side of each of the extension parts EXT1 to EXT4 adjacent to a first side of each of the circuit parts; a second side L2 is in contact with a side of each of the extension parts EXT1 to EXT4 adjacent to a second side of each of the circuit parts; and a third side L3 is in contact with the transparent part TA. Each of the circuit parts CA1 to CA4 may have a shape of a right triangle having the longest side in contact with the transparent part TA, but is not limited thereto. Although the third side L3 is illustrated in phantom in FIG. 4, and appears to be separated from the transparent part TA, the third side L3 may be in contact with the transparent part TA as just described.

In the embodiment, the length of the third side L3 of each of the circuit parts CA1 to CA4 is longer than the length of a fourth side L4 of each of the extension parts EXT1 to EXT4 which is not in contact with each of the circuit parts CA1 to CA4 and is in contact with the transparent part TA. For example, the length of the third side L3 of each of the circuit parts CA1 to CA4 may be approximately twice the length of the fourth side L4 of each of the extension parts EXT1 to EXT4 which is not in contact with each of the circuit parts CA1 to CA4 and is in contact with the transparent part TA. In this case, the third side L3 of one sub-pixel and the fourth side L4 surround the transparent part. The length of the third side L3 and the length of the fourth side L4 of the extension part adjacent to the circuit part have a ratio of 1:½. Accordingly, one transparent part TA surrounded by four sub-pixels R, G, B, and W belonging to different unit pixels, respectively, may have an overall regular octagonal shape. In such an embodiment, a distance between each of the extension parts EXT1 to EXT4 and the center of the transparent part TA adjacent thereto relative to the first axis and a distance therebetween relative to the second axis are the same. For example, as shown in FIG. 4, a transparent part TA may be adjacent the first extension part EXT1 and the second extension part EXT2. A distance between the first extension part EXT1 and the center of the transparent part TA along the AXIS1 direction may be substantially the same as a distance between the second extension part EXT2 and the center of the transparent part TA along the AXIS2 direction. In one embodiment, the distance is measured between the center of the respective extension part EXT1-EXT4 and the center of the transparent part TA. In one embodiment, the distance is measured between a nearest side of the respective extension part EXT1-EXT4 and the center of the transparent part TA. For example, the nearest edge may be the fourth side L4. Distance between each of the first, second, third and fourth extension parts EXT1-EXT4 and the center of the transparent part TA adjacent thereto may be substantially the same (e.g., regardless of reference to the axes AXIS1, AXIS2).

Accordingly, when the transparent part TA is an overall regular octagonal shape, diffraction of light at the edge of the transparent part TA can be minimized, and as a result, haze at the edge thereof can be reduced. This improves the visibility of the transparent part TA, which improves the sharpness of the entirety of the display panel 50.

Each of the sub-pixels R, G, B, and W emits light through the light emitting element LD arranged in the light emitting part EA1 or EA2. In the embodiment of the present disclosure, each of the sub-pixels R, G, B, and W may include two light emitting parts EA1 and EA2. The light emitting part EA1 or EA2 of a sub-pixel is arranged by overlapping each of the circuit parts CA1 to CA4 and each of the extension parts EXT1 to EXT4 of the sub-pixel. When each of the sub-pixels R, G, B, and W has a plurality of light emitting parts EA1 and EA2, each of the plurality of the light emitting parts EA1 and EA2 may overlap each of the circuit parts CA1 to CA4 and each of the extension parts EXT1 to EXT4. Accordingly, when the light emitting parts EA1 and EA2 of a sub-pixel are arranged by overlapping each of the circuit parts CA1 to CA4 and each of the extension parts EXT1 to EXT4 of the sub-pixel, the occurrence of the parasitic capacitor between adjacent sub-pixels can be prevented.

In the embodiment, the sub-pixels R, G, B, and W has shapes and structures symmetrical to adjacent different sub-pixels R, G, B, and W, respectively, relative to the first axis AXIS1 and the second axis AXIS2. That is, the red sub-pixel R and the white sub-pixel W are symmetrical to each other relative to the second axis AXIS2, and the green sub-pixel G and the blue sub-pixel B are symmetrical to each other relative to the second axis AXIS2. In addition, the red sub-pixel R and the blue sub-pixel B are symmetrical to each other relative to the first axis AXIS1, and the white sub-pixel W and the green sub-pixel G are symmetrical to each other relative to the first axis AXIS1. Except for being mirrored relative to the first axis AXIS1 or the second axis AXIS2, the sub-pixels R, G, B, and W have shape, area and structure substantially similar to each other. That is, the circuit elements, the wires, and the light emitting elements, respectively, located in the sub-pixels R, G, B, and W may have substantially similar shapes and areas.

The sub-pixels R, G, B, and W have shapes and structures substantially similar to each other, so the sub-pixels R, G, B, and W can be equally designed in the same way, and deviation between the sub-pixels R, G, B, and W can be minimized. In addition, when changing a circuit, such as changing the size of a transistor, it is easy to modify all the sub-pixels R, G, B, and W, so the degree of the design freedom of the display panel 50 can be improved.

Hereinafter, the planar structure and stacked structure (a cross-section structure) of the pixel part PA according to the embodiment will be described in more detail with reference to the following drawings.

Figure 5:
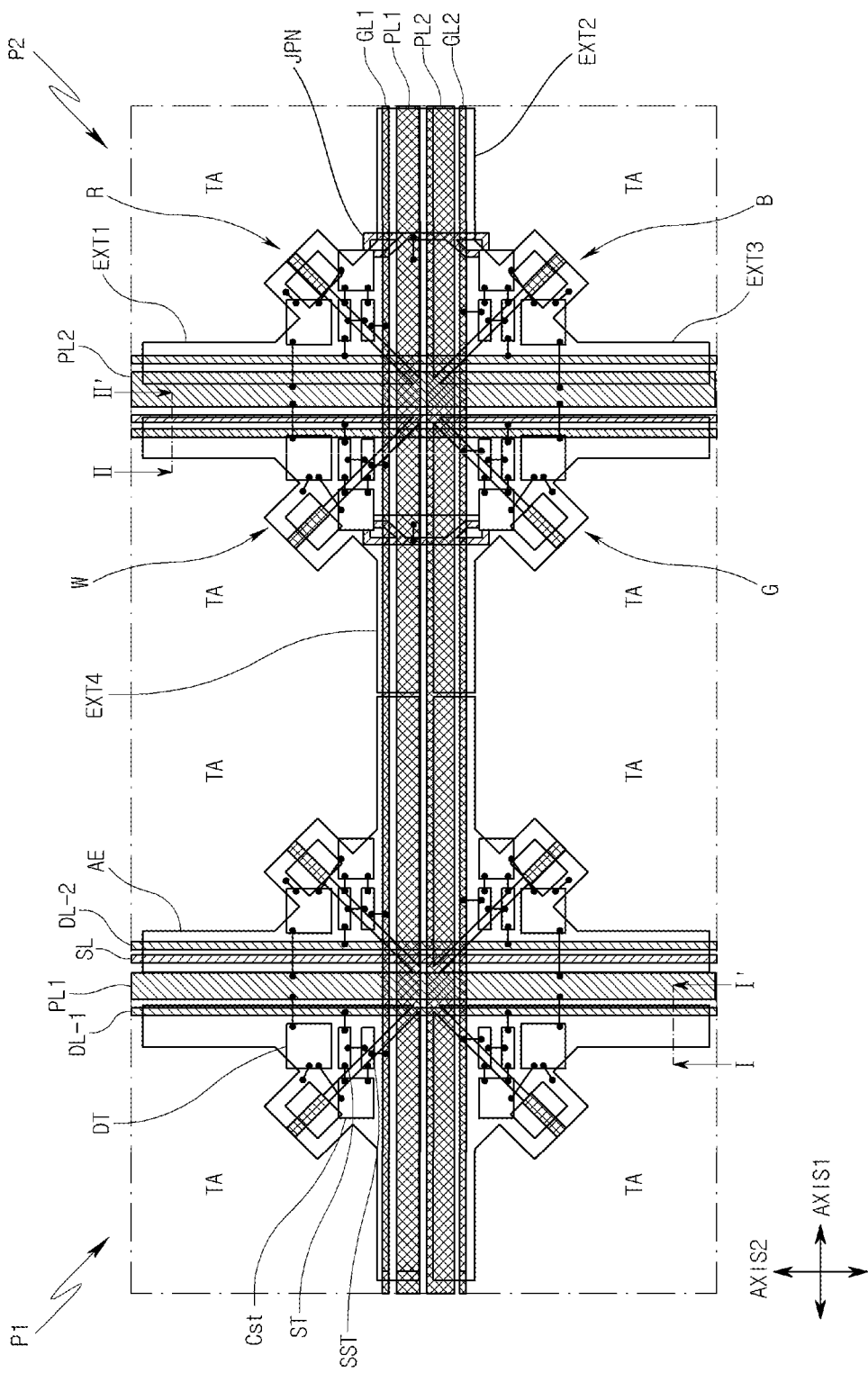
FIG. 5 a top plan view illustrating, in detail, the structure of the unit pixel illustrated in FIG. 4.
Figure 6:
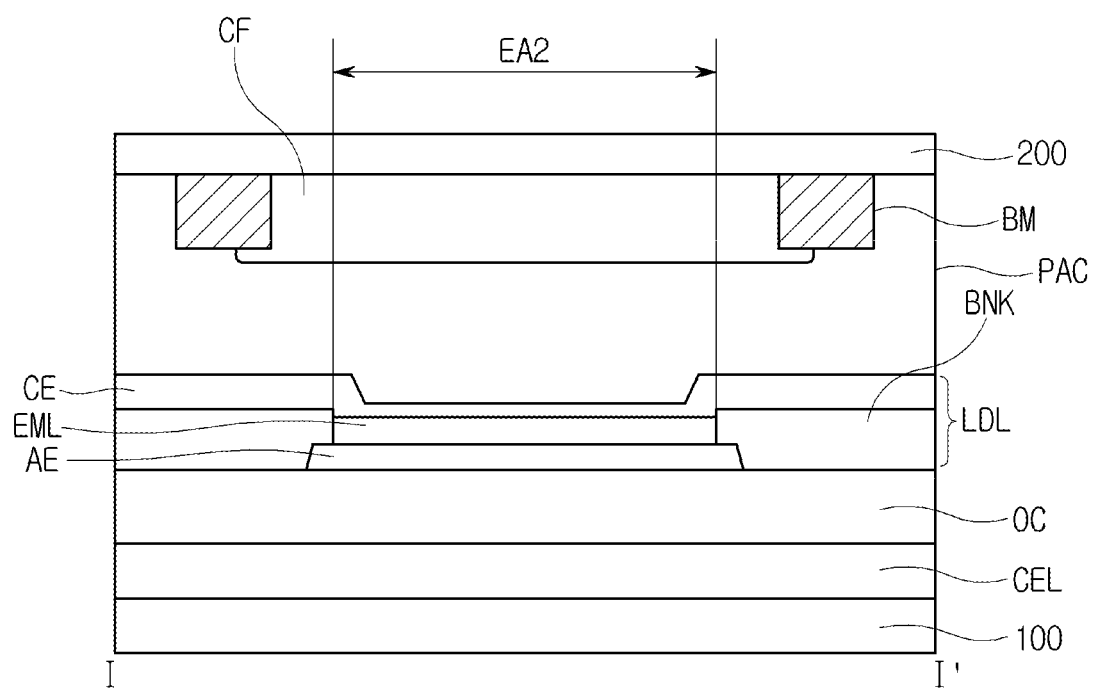
FIG. 6 is a sectional view taken along line I-I' of FIG. 5.
Figure 7:
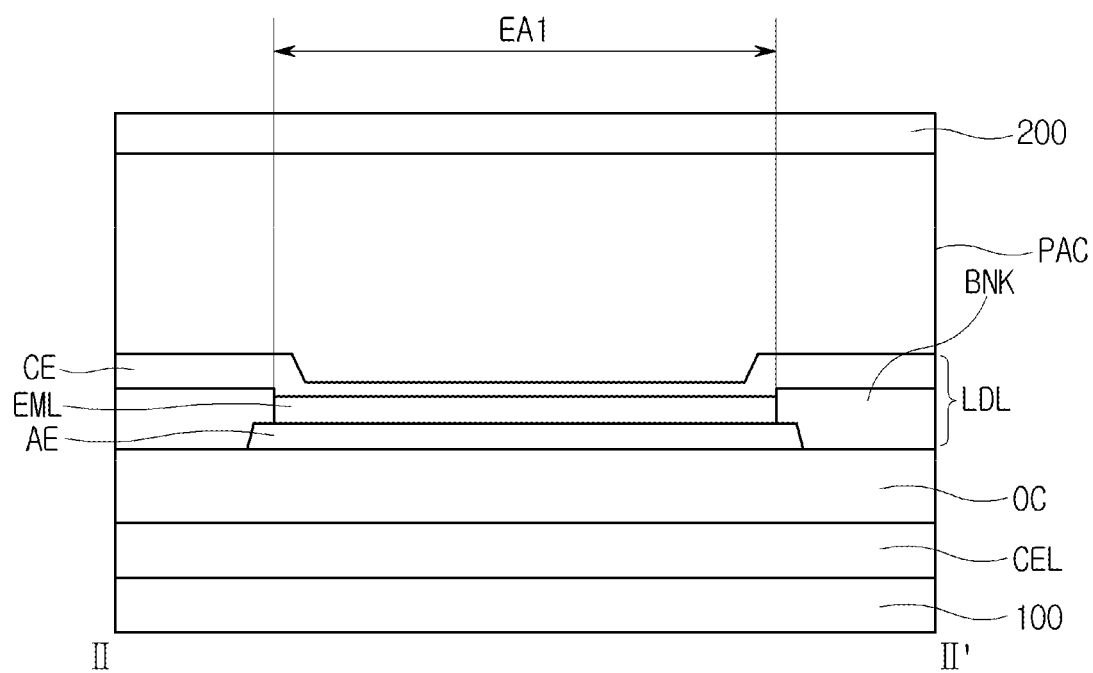
FIG. 7 is a sectional view taken along line II-II' of FIG. 5.

FIG. 5 a top plan view illustrating, in detail, the structure of the unit pixel illustrated in FIG. 4; FIG. 6 is a sectional view taken along line I-I' of FIG. 5; and FIG. 7 is a sectional view taken along line II-II' of FIG. 5.

In FIG. 5, two adjacent unit pixels P1 and P2 are illustrated. Each of the unit pixels P1 and P2 may include the sub-pixels R, G, B, and W that emit red, green, blue and white colored lights, respectively. Each of the sub-pixels R, G, B, and W may be arranged at a predetermined position or selected position in the pixel part PA of each of the unit pixels P1 and P2. An area in which light is emitted by each of the sub-pixels R, G, B, and W may be defined as the light emitting part EA1 or EA2. The transparent part TA may be formed in an area that excludes the pixel part PA in each of the unit pixels P1 and P2.

As illustrated in the drawing, the pixel part PA includes the second and fourth extension parts EXT2 and EXT4 extending in directions opposite to each other along the first axis AXIS1, and the first and third extension parts EXT1 and EXT3 extending in directions opposite to each other along the second axis AXIS2 intersecting with the first axis AXIS1.

In the embodiment of the present disclosure, each of the extension parts EXT1 to EXT4 has shape and structure (a configuration) substantially similar to each other. That is, the length and width of each of the extension parts EXT1 to EXT4 in extending direction thereof are the same. In such an embodiment, the extension parts EXT1 to EXT4 have shapes symmetrical to adjacent different extension parts EXT1 to EXT4, respectively, relative to the first axis AXIS1 and the second axis AXIS2.

Wires are disposed in the extension parts EXT1 to EXT4. For example, the data line DL and the sensing line SL are disposed in the first and third extension parts EXT1 and EXT3 such that the data line DL and the sensing line SL extend along the second axis AXIS2, and the first and second gate lines GL1 and GL2 are disposed in the second and fourth extension parts EXT2 and EXT4 such that the first and second gate lines GL1 and GL2 extend along the first axis AXIS1. That is, the data line DL and the sensing line SL extend via the first and third extension parts EXT1 and EXT3, and the first and second gate lines GL1 and GL2 extend via the second and fourth extension parts EXT2 and EXT4.

In the embodiment of the present disclosure, the data line DL may include a first sub-data line DL-1 configured to apply a data signal to the white sub-pixel W and the green sub-pixel G disposed to be adjacent to each other along the extending direction of the data line DL (that is, the second axis AXIS2). In addition, the data line DL may include a second sub-data line DL-2 configured to apply a data signal to the red sub-pixel R and the blue sub-pixel B disposed to be adjacent to each other along the extending direction of the data line DL.

Each of the first and second gate lines GL1 and GL2, the data line DL, and the sensing line SL may be coupled with circuit elements disposed at each of the circuit parts CA1 to CA4 through a contact hole formed in each of the circuit parts CA1 to CA4.

The power lines PL1 and PL2 are disposed in each of the extension parts EXT1 to EXT4. The power lines PL1 and PL2 may include a first power line PL1 configured to apply the high potential drive voltage ELVDD to each of the sub-pixels R, G, B, and W and a second power line PL2 configured to apply a low potential drive voltage ELVSS thereto.

Each of the first power line PL1 and the second power line PL2 may extend along the first axis AXIS1 and the second axis AXIS2 to have a mesh structure. In such an embodiment, each of the first power line PL1 and the second power line PL2 has a first pattern extending along the first axis AXIS1 from each of the first and third extension parts EXT1 and EXT3 and a second pattern extending along the second axis AXIS2 from each of the second and fourth extension parts EXT2 and EXT4. The first pattern and the second pattern may be electrically coupled with each other.

In general, the first power line PL1, which applies the high potential drive voltage ELVDD, may be larger in thickness and width than other wires. Accordingly, when the first power line PL1 is arranged only in some portions of the extension parts EXT1 to EXT4, each width of the extension parts EXT1 to EXT4 is set to be different from each other, so the extension parts EXT1 to EXT4 may not have shapes similar to each other.

In the embodiment of the present disclosure, each of the first power line PL1 and the second power line PL2 has a mesh structure by being arranged in all extension parts EXT1 to EXT4, so the number and entire width of the wires disposed in all the extension parts EXT1 to EXT4 may be configured to be the same. As a result, due to each of the first power line PL1 and the second power line PL2 having the mesh structure, all the extension parts EXT1 to EXT4 may have shapes and structures substantially similar to each other.

However, the embodiment of the present disclosure is not limited thereto. That is, in various other embodiments, the first pattern of at least one of the first power line PL1 and the second power line PL2 may be omitted in a pixel P.

In the embodiment, only the first pattern of any one of the first power line PL1 and the second power line PL2 may be disposed in each of the first and third extension parts EXT1 and EXT3. For example, the first pattern of the first power line PL1 is disposed in each of the first and third extension parts EXT1 and EXT3 of any one of two adjacent unit pixels P1 and P2, and the first pattern of the second power line PL2 may be disposed in each of the first and third extension parts EXT1 and EXT3 of the remaining one of the two adjacent unit pixels P1 and P2.

As described above, each of the extension parts EXT1 to EXT4 has the same width. Accordingly, when only any one of the first and second power lines PL1 and PL2 is disposed in each of the first and third extension parts EXT1 and EXT3, the disposed power line PL1 or PL2 may be formed to have a larger width. Accordingly, the width of the power lines PL1 and PL2 is freely adjusted, so the display panel 50 can stably supply a drive voltage to the unit pixels P1 and P2.

In the embodiment, in a unit pixel P2 in which the first pattern of the first power line PL1 is not provided, a jumping line JPN which couples the second pattern of the first power line PL1 with the drive transistor DT may be provided therebetween. The jumping line JPN may extend in the direction of the second axis AXIS2. The first and second ends of the jumping line JPN may be coupled to the drain electrode of the drive transistor DT disposed in the associated unit pixel P2. The jumping line JPN may be coupled to the second pattern of the first power line PL1 through a contact hole. Accordingly, the high potential drive voltage ELVDD applied through the second pattern of the first power line PL1 may be transmitted to the associated unit pixel P2.

Each of the first to fourth circuit parts CA1 to CA4 is disposed between each of adjacent extension parts EXT1 to EXT4 extending in directions different from each other. For example, the first circuit part CA1 is disposed between the second extension part EXT2 extending along the first axis AXIS1 and the first extension part EXT1 extending along the second axis AXIS2 and adjacent to the second extension part EXT2. The second circuit part CA2 is disposed between the third extension part EXT3 extending along the second axis AXIS2 and the second extension part EXT2 extending along the first axis AXIS1 and adjacent to the third extension part EXT3. The third circuit part CA3 is disposed between the fourth extension part EXT4 extending along the first axis AXIS1 and the third extension part EXT3 extending along the second axis AXIS2 and adjacent to the fourth extension part EXT4. In addition, the fourth circuit part CA4 is disposed between the first extension part EXT1 extending along the second axis AXIS2 and the fourth extension part EXT4 extending along the first axis AXIS1 and adjacent to the first extension part EXT1.

In the embodiment, the circuit parts CA1 to CA4 have shapes symmetrical to adjacent different circuit parts CA1 to CA4, respectively, relative to the first axis AXIS1 and the second axis AXIS2. Except that the circuit parts CA1 to CA4 and the adjacent different circuit parts CA1 to CA4 are symmetrical to each other, each of the first to fourth circuit parts CA1 to CA4 and each of the adjacent different circuit parts CA1 to CA4 have shapes and structures substantially similar to each other.

The circuit elements are disposed in each of the circuit parts CA1 to CA4. For example, the active layer and the source, drain, and gate electrodes constituting the transistors, and electrodes constituting the capacitor may be disposed in each of the circuit parts CA1 to CA4.

The transistors and the electrodes of the capacitor may be electrically coupled with the wires formed in each of the extension parts EXT1 to EXT4 through a contact hole. The circuit elements disposed in each of the circuit parts CA1 to CA4 can control the amount of current applied to the light emitting element LD in response to a signal applied through the wires.

The light emitting parts EA1 and EA2 are disposed in the pixel part PA. Each of the light emitting parts EA1 and EA2 is disposed by overlapping each of the extension parts EXT1 to EXT4 and each of the circuit parts CA1 to CA4 corresponding to the light emitting part.

In the embodiment, each of the sub-pixels R, G, B, and W may include two light emitting parts EA1 and EA2. When each of the sub-pixels R, G, B, and W is provided with a plurality of light emitting parts EA1 and EA2, each of the light emitting parts EA1 and EA2 may be disposed by overlapping each of the extension parts EXT1 to EXT4 and each of the circuit parts CA1 to CA4 of the associated sub-pixel R, G, B, or W. For example, in one sub-pixel, a first light emitting part EA1 may be disposed by overlapping a first portion of the circuit part and an extension part disposed at a first side of the circuit part, and a second light emitting part EA2 may be disposed by overlapping a second portion of the circuit part and an extension part disposed at a second side of the circuit part. Accordingly, when the light emitting parts EA1 and EA2 of a sub-pixel R, G, B, or W are disposed by overlapping each of the extension parts EXT1 to EXT4 and each of the circuit parts CA1 to CA4 of the associated sub-pixel R, G, B, or W, the occurrence of the parasitic capacitor between adjacent sub-pixels R, G, B, and W can be prevented.

The light emitting part EA1 or EA2 corresponds to the shape of each of the extension parts EXT1 to EXT4 at a portion at which the light emitting part EA1 or EA2 overlaps each of the extension parts EXT1 to EXT4. In addition, the light emitting part EA1 or EA2 corresponds to the shape of each of the circuit parts CA1 to CA4 at a portion at which the light emitting part EA1 or EA2 overlaps each of the circuit parts CA1 to CA4. As described later, the light emitting part EA1 or EA2 may be defined by the exposed portion of the anode electrode AE of the light emitting element LD, so such a shape of the light emitting part EA1 or EA2 may correspond to the patterned shape of the anode electrode AE.

The light emitting element LD is disposed at the light emitting part EA1 or EA2. The light emitting elements LD disposed at the light emitting parts EA1 and EA2 are electrically coupled to the drive transistor DT and receive a drive current via the drive transistor DT.

Hereinafter, the stacked structure (a cross-section structure) of the unit pixel P illustrated in FIG. 5 will be described.

Referring to FIGS. 6 and 7, the unit pixel P may include a substrate 100, and a circuit element layer CEL and a light emitting element layer LDL which are arranged on the substrate 100.

The substrate 100 as a base of the display panel 50 may be a substrate which passes light therethrough. The substrate 100 may be a rigid substrate including glass or tempered glass or may be a flexible substrate made of plastic. For example, the substrate 100 may be made of a plastic material such as polyimide, polyethylene terephthalate (PET), polyethylene naphthalate (PEN), and polycarbonate (PC). However, the material of the substrate 100 is not limited to the materials described above.

At least one transistor and a capacitor as the circuit elements constituting each of the sub-pixels R, G, B, and W and wires may be arranged at the circuit element layer CEL. A transparent insulating layer may be arranged between electrodes constituting each of the circuit elements such that the electrodes can be electrically insulated therebetween. The circuit element may be covered with a passivation layer and be protected from foreign matter.

An overcoat layer OC may be formed on the circuit element layer CEL. The overcoat layer OC may be a planarization film configured to alleviate the step of a lower structure, and may be made of an organic material such as polyimide, benzocyclobutene series resin, or acrylate.

The light emitting element layer LDL is formed on the overcoat layer OC and includes the light emitting elements LD. Each of the light emitting elements LD includes an anode electrode AE, a light emitting layer EML, and a cathode electrode CE. In a case in which the display panel 50 is a display panel emitting light at a front surface thereof, the anode electrode AE may be a reflective electrode, and the cathode electrode CE may be a transmissive electrode. However, in a case in which the display panel 50 is a display panel emitting light at a rear surface thereof, the anode electrode AE may be a transmissive electrode, and the cathode electrode CE may be a reflective electrode.

The anode electrode AE is formed on the overcoat layer OC. The anode electrode AE may be made of a transparent conductive material such as indium tin oxide (ITO), indium zinc oxide (IZO), or zinc oxide (ZnO). When the anode electrode AE is a reflective electrode, the anode electrode AE may include a reflective layer. The reflective layer may be made of aluminum (Al), copper (Cu), silver (Ag), nickel (Ni) or an alloy thereof. In the embodiment, the reflective layer may be made of silver, palladium, or a copper alloy (APC).

A bank BNK is formed on the overcoat layer OC. The bank BNK may be a defining layer defining the light emitting part EA1 or EA2 of each of the sub-pixels R, G, B, and W. In the unit pixel P, the remaining area that excludes the light emitting part EA1 or EA2 may be defined as a non-light emitting part. The bank BNK may be formed of an organic film such as an acrylic resin, an epoxy resin, a phenolic resin, a polyamide resin, or a polyimide resin.

The bank BNK is formed to cover a part (for example, a portion of an edge) of the anode electrode AE, and the light emitting layer EML is formed at the exposed part of the anode electrode AE which is not covered by the bank BNK. The light emitting layer EML may have a multilayer thin film structure including a light generating layer. An area in which the light emitting layer EML is formed may be defined as the light emitting part EA1 or EA2 of each of the sub-pixels R, G, B, and W. In the light emitting part EA1 or EA2, the anode electrode AE, the light emitting layer EML, and the cathode electrode CE are stacked to be in direct contact with each other.

The cathode electrode CE is formed on the light emitting layer EML. The cathode electrode CE may be widely formed in the light emitting part EA1 or EA2 and the non-light emitting part. The cathode electrode CE may be formed of a transparent conductive material (TCO) which can transmit light therethrough or a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. When the cathode electrode CE is formed of the semi-transmissive conductive material, the light output efficiency of the cathode electrode may be increased due to a micro cavity thereof.

The circuit element and the light emitting element can be covered by an encapsulation layer PAC. The encapsulation layer PAC prevents external moisture from being introduced into the circuit element and the light emitting element. The encapsulation layer PAC may be formed of an inorganic insulating material or may be configured as a structure in which an inorganic insulating material and an organic insulating material are alternately stacked, but is not necessarily limited thereto.

A cover substrate 200 may be formed on the encapsulation layer PAC. The cover substrate 200 may be adhered on the encapsulation layer PAC through an adhesive.

A color filter CF may be formed between the encapsulation layer PAC and the cover substrate 200. The color filter CF may be disposed to overlap the light emitting part EA1 or EA2. The color filter CF is a wavelength-selective optical filter that passes light in a specific wavelength band therethrough and blocks light in other specific wavelength bands to selectively pass only incident light in a partial wavelength band therethrough, and may be made of a photosensitive resin including a colorant such as a pigment or dye. Light which is generated in the light emitting element LD and passes through the color filter CF may have any one of red, green, and blue colors. The color filter CF for the sub-pixel W which displays a white color may be omitted.

A black matrix BM is formed between color filters CF and can prevent light leakage between the light emitting parts EA1 and EA2. In the embodiment of the present disclosure, the pixel part PA has the shape of a cross and thus the sub-pixels R, G, B, and W having colors different from each other are spaced apart from each other in different directions, so light leakage between the sub-pixels R, G, B, and W is minimized. Accordingly, the black matrix BM for the white sub-pixel W may be omitted.

In an area in which the white sub-pixel W is arranged, the color filter CF and the black matrix BM are omitted. Accordingly, the light emitting part EA1 or EA2 of the white sub-pixel W illustrated in FIG. 7 has a larger area than the light emitting parts EA1 and EA2 of other colored sub-pixels R, G, and B illustrated in FIG. 6. As the area of the light emitting part EA1 or EA2 of the white sub-pixel W increases, the loss of light emission of the white sub-pixel W is minimized and image quality thereof can be improved.

Particularly, when the color filter CF is omitted in the white sub-pixel W, the black matrix BM may be omitted between sub-pixels adjacent to the white sub-pixel W. In this case, in the unit pixel P, an area occupied by the black matrix BM may be remarkably decreased. As a result, the area of the transparent parts TA on the display panel 50 may be relatively increased, and the transparency of the display device can be effectively improved.

Figure 8:
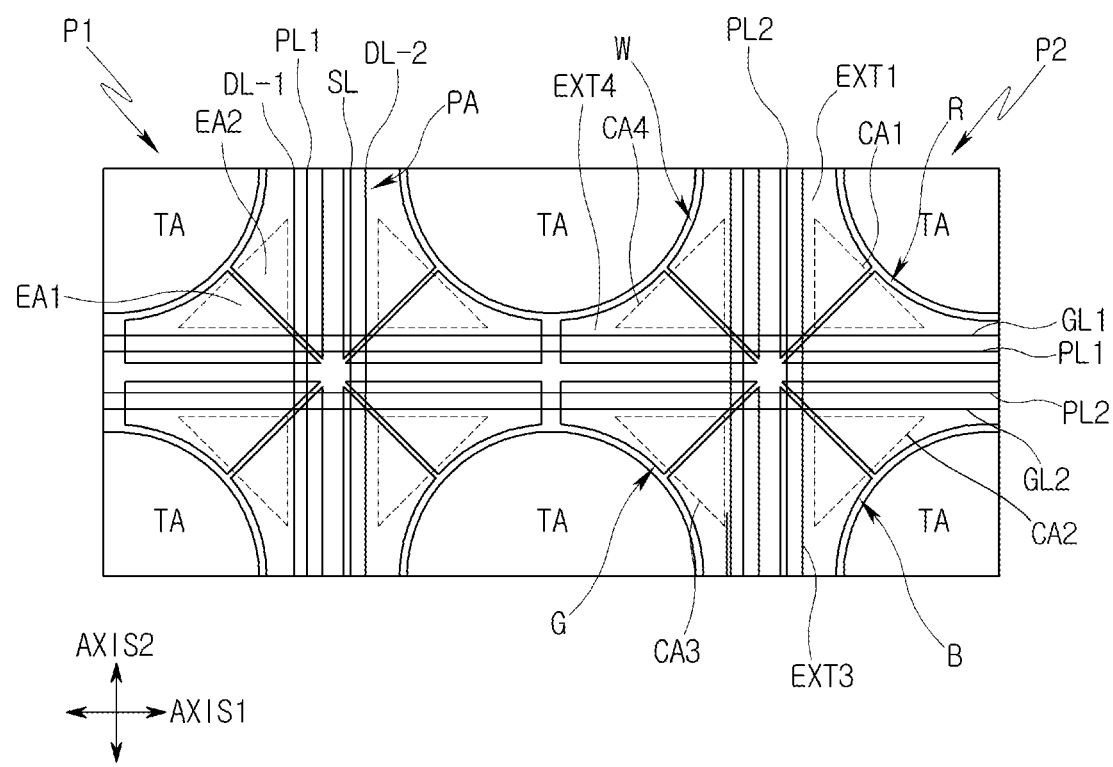
FIG. 8 is a top plan view roughly illustrating the structure of the unit pixel according to another embodiment.

FIG. 8 is a top plan view roughly illustrating the structure of the unit pixel according to another embodiment.

Referring to FIG. 8, under a pixel arrangement structure based on four sub-pixels, the unit pixel P may include the sub-pixels R, G, B, and W that emit red, green, blue, and white lights, respectively. Each of the sub-pixels R, G, B, and W may be arranged at a predetermined position or selected position in the pixel part PA of the unit pixel P. An area in which light is emitted by each of the sub-pixels R, G, B, and W may be defined as the light emitting part EA1 or EA2. In the unit pixel P, the transparent part TA may be formed in an area that excludes the pixel part PA.

The pixel part PA may have a shape of a cross. That is, the pixel part PA is provided with first to fourth extension parts EXT1 to EXT4 extending in directions different from each other. Each of the first to fourth circuit parts CA1 to CA4 is disposed between each of the extension parts EXT1 to EXT4 extending in directions different from each other. The light emitting part EA1 and EA2 may be disposed in the pixel part PA. Each of light emitting parts EA1 and EA2 is disposed by overlapping the extension parts EXT1 to EXT4 and the circuit parts CA1 to CA4 corresponding thereto. One sub-pixel R, G, B, or W may be disposed between two adjacent extension parts of the extension parts EXT1 to EXT4 and in one circuit part disposed therebetween.

Wires are disposed in the first to fourth extension parts EXT1 to EXT4 so as to apply signals to circuit elements disposed in each of the circuit parts CA1 to CA4. For example, the wires may include the gate lines GL1 and GL2, the data line DL, the sensing line SL, and the power lines PL1 and PL2 described with reference to FIG. 2.

The circuit elements constituting each of the sub-pixels R, G, B, and W are disposed in the first to fourth circuit parts CA1 to CA4. For example, the circuit elements may include the drive transistor DT, the switching transistor ST, the sensing transistor SST, and the storage capacitor Cst described with reference to FIG. 2.

Each of the sub-pixels R, G, B, and W emits light through the light emitting element LD arranged in the light emitting part EA1 or EA2. In the embodiment of the present disclosure, each of the sub-pixels R, G, B, and W may include two light emitting parts EA1 and EA2. The light emitting part EA1 or EA2 of a sub-pixel is disposed by overlapping each of the circuit parts CA1 to CA4 and each of the extension parts EXT1 to EXT4 of the sub-pixel. When each of the sub-pixels R, G, B, and W has a plurality of light emitting parts EA1 and EA2, each of the plurality of light emitting parts EA1 and EA2 may overlap the circuit part CA and the wiring part WA.

Particularly, in the embodiment of the present disclosure, each of the light emitting parts EA1 and EA2 has one curved side and has a three-sided shape as a whole. The one side formed to be curved may be in contact with the transparent part TA. The one curved side of each of the light emitting parts EA1 and EA2 protrudes more toward the transparent part TA than each of the circuit parts CA1 to CA4 overlapping the light emitting parts. Accordingly, the transparent part TA may have an edge defined by the curved side of each of the light emitting parts EA1 and EA2. For example, the transparent part TA may be surrounded by four sub-pixels adjacent to each other provided in each of the unit pixels different from each other. In addition, the transparent part TA may have an edge defined by the curved side of the light emitting part in each of the four sub-pixels. In such an embodiment, the transparent part TA may have a circular or oval shape as a whole.

Accordingly, when each of the transparent parts TA has an overall circular shape, diffraction of light at the edge of each of the transparent parts TA may further be decreased than in the embodiment illustrated in FIG. 4.

In the embodiment of the present disclosure, the sub-pixels R, G, B, and W have shapes and structures symmetrical to adjacent different sub-pixels R, G, B, and W, respectively, relative to the first axis AXIS1 and the second axis AXIS2. The sub-pixels R, G, B, and W has shapes and structures substantially similar to each other, so the sub-pixels R, G, B, and W may be equally designed in the same manner, and deviation between the sub-pixels R, G, B, and W can be minimized. In addition, when changing a circuit, such as changing the size of a transistor, it is easy to modify all the sub-pixels R, G, B, and W, so the degree of the design freedom of the display panel 50 can be improved.

Hereinafter, the planar structure of the pixel part PA according to the embodiment will be described in more detail with reference to the drawings.

Figure 9:
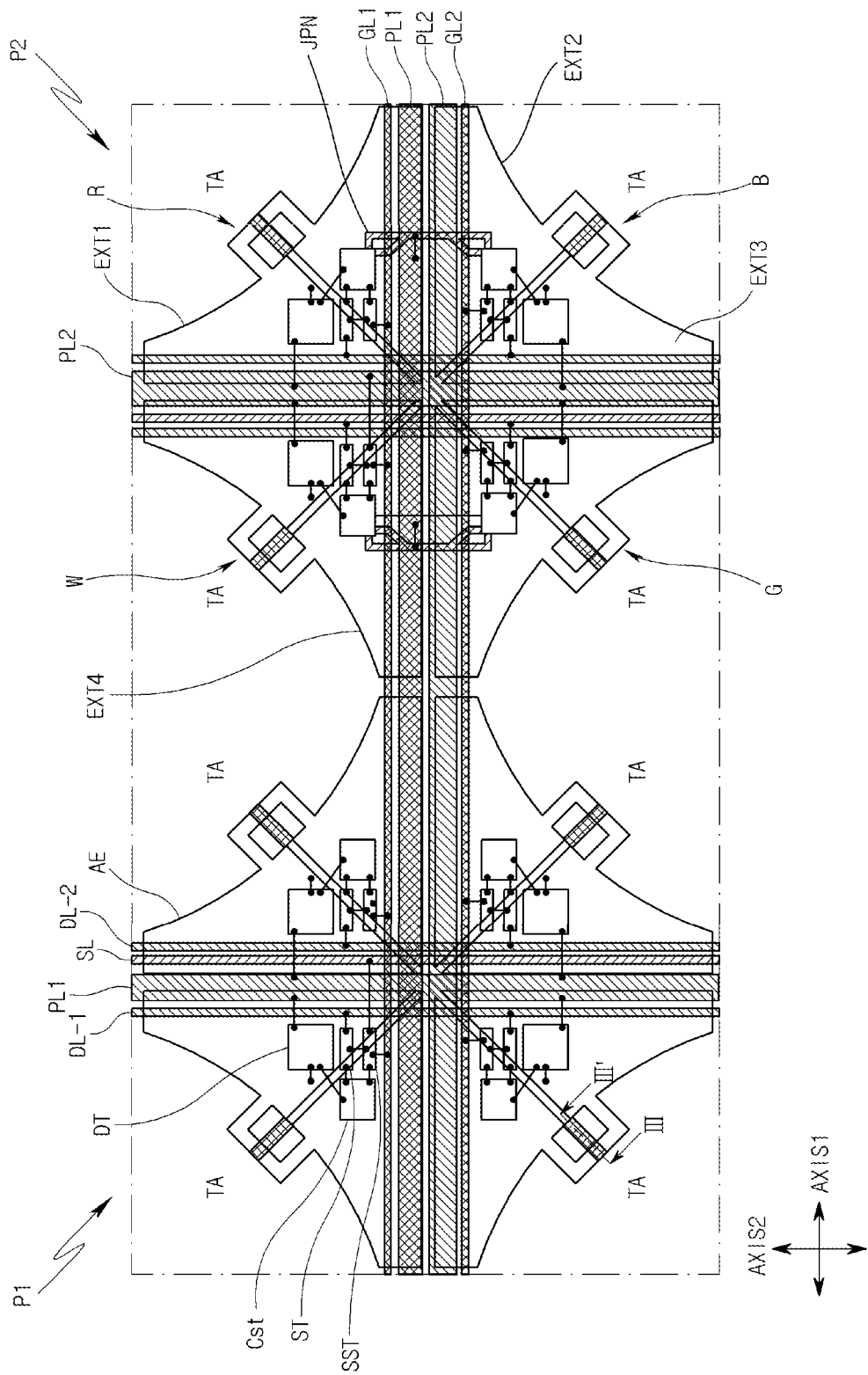
FIG. 9 is a top plan view illustrating, in detail, the structure of the unit pixel illustrated FIG. 8.

FIG. 9 is a top plan view illustrating, in detail, the structure of the unit pixel illustrated FIG. 8.

In FIG. 9, two unit pixels P1 and P2 adjacent to each other are illustrated. Each of the unit pixels P1 and P2 may include the sub-pixels R, G, B, and W that emit red, green, blue, and white colors, respectively. Each of the sub-pixels R, G, B, and W may be disposed at a predetermined position or selected position in the pixel part PA of each of the unit pixels P1 and P2. An area in which light is emitted by each of the sub-pixels R, G, B, and W may be defined as the light emitting part EA1 or EA2. The transparent part TA may be formed in an area that excludes the pixel part PA in each of the unit pixels P1 and P2.

The pixel part PA may have a shape of a cross. As illustrated in the drawing, the pixel part PA includes the second and fourth extension parts EXT2 and EXT4 extending in directions opposite to each other along the first axis AXIS1, and the first and third extension parts EXT1 and EXT3 extending in directions opposite to each other along the second axis AXIS2 intersecting with the first axis AXIS1.

In the embodiment of the present disclosure, each of the extension parts EXT1 to EXT4 has shape and area substantially similar to each other. That is, the length and width of each of the extension parts EXT1 to EXT4 in extending direction thereof are the same. In such an embodiment, the extension parts EXT1 to EXT4 have shapes symmetrical to adjacent different extension parts EXT1 to EXT4, respectively, relative to the first axis AXIS1 and the second axis AXIS2.

Wires are disposed in the extension parts EXT1 to EXT4. For example, the data line DL and the sensing line SL are disposed in the first and third extension parts EXT1 and EXT3 such that the data line DL and the sensing line SL extend along the second axis AXIS2, and the first and second gate lines GL1 and GL2 are disposed in the second and fourth extension parts EXT2 and EXT4 such that he first and second gate lines GL1 and GL2 extend along the first axis AXIS1.

In the embodiment, the data line DL may include the first sub-data line DL-1 configured to apply a data signal to the white sub-pixel W and the green sub-pixel G disposed to be adjacent to each other along the extending direction (that is, the second axis AXIS2) of the data line DL. In addition, the data line DL may include a second sub-data line DL-2 configured to apply a data signal to the red sub-pixel R and the blue sub-pixel B disposed to be adjacent to each other along the extending direction of the data line DL.

The power lines PL1 and PL2 are disposed in each of the extension parts EXT1 to EXT4. The power lines PL1 and PL2 may include the first power line PL1 configured to apply the high potential drive voltage ELVDD to each of the sub-pixels R, G, B, and W and the second power line PL2 configured to apply the low potential drive voltage ELVSS to each of the sub-pixels R, G, B, and W.

Each of the first power line PL1 and the second power line PL2 may extend along the first axis AXIS1 and the second axis AXIS2 to have a mesh structure. In such an embodiment, each of the first power line PL1 and the second power line PL2 has the first pattern extending along the first axis AXIS1 from each of the first and third extension parts EXT1 and EXT3 and the second pattern extending along the second axis AXIS2 from each of the second and fourth extension parts EXT2 and EXT4. The first pattern and the second pattern may be electrically coupled with each other.

In the embodiment, only the first pattern of any one of the first power line PL1 and the second power line PL2 may be disposed in each of the first and third extension parts EXT1 and EXT3. For example, the first pattern of the first power line PL1 is disposed in each of the first and third extension parts EXT1 and EXT3 of any one of two adjacent unit pixels P1 and P2, and the first pattern of the second power line PL2 may be disposed in each of the first and third extension parts EXT1 and EXT3 of the remaining one of the two adjacent unit pixels P1 and P2.

Each of the first to fourth circuit parts CA1 to CA4 is disposed between each of adjacent extension parts EXT1 to EXT4 extending in directions different from each other. The circuit parts CA1 to CA4 have shapes symmetrical to adjacent different circuit parts CA1 to CA4, respectively, relative to the first axis AXIS1 and the second axis AXIS2. Furthermore, each of the first to fourth circuit parts CA1 to CA4 has shape and area substantially similar to each other.

The circuit elements are disposed in each of the circuit parts CA1 to CA4. For example, the active layer and the source, drain, and gate electrodes constituting the transistors, and electrodes constituting the capacitor may be disposed in each of the circuit parts CA1 to CA4.

The light emitting parts EA1 and EA2 are disposed in the pixel part PA. Each of the light emitting parts EA1 and EA2 is disposed by overlapping each of the extension parts EXT1 to EXT4 and each of the circuit parts CA1 to CA4 corresponding to the light emitting part.

In the embodiment, each of the sub-pixels R, G, B, and W may include two light emitting parts EA1 and EA2. When each of the sub-pixels R, G, B, and W is provided with a plurality of the light emitting parts EA1 and EA2, each of the light emitting parts EA1 and EA2 may be disposed by overlapping each of the extension parts EXT1 to EXT4 and each of the circuit parts CA1 to CA4 of the associated sub-pixel R, G, B, or W.

The light emitting element LD is disposed in the light emitting part EA1 or EA2. The light emitting elements LD disposed in the light emitting parts EA1 and EA2 are electrically coupled to the drive transistor DT and receive a drive voltage via the drive transistor DT.

Hereinafter, the connection relation of the circuit elements disposed in the circuit part CA will be briefly described.

The first electrode of the drive transistor DT can be coupled to the first power line PL1, and the second electrode of the drive transistor DT can be coupled to the anode electrode AE via the first electrode of the storage capacitor Cst. The gate electrode of the drive transistor DT can be coupled to a second electrode of the storage capacitor Cst.

The first electrode of the switching transistor ST can be coupled to the data line DL-1, and the second electrode of the switching transistor ST can be coupled to the gate electrode of the drive transistor DT via the second electrode of the storage capacitor Cst. The gate electrode of the switching transistor ST can be coupled to the first gate line GL1.

The first electrode of the sensing transistor SST can be coupled to the sensing line SL, and the second electrode of the sensing transistor SST can be coupled to the first electrode of the storage capacitor Cst. The gate electrode of the sensing transistor SST can be coupled to the second gate line GL2.

Figure 10:
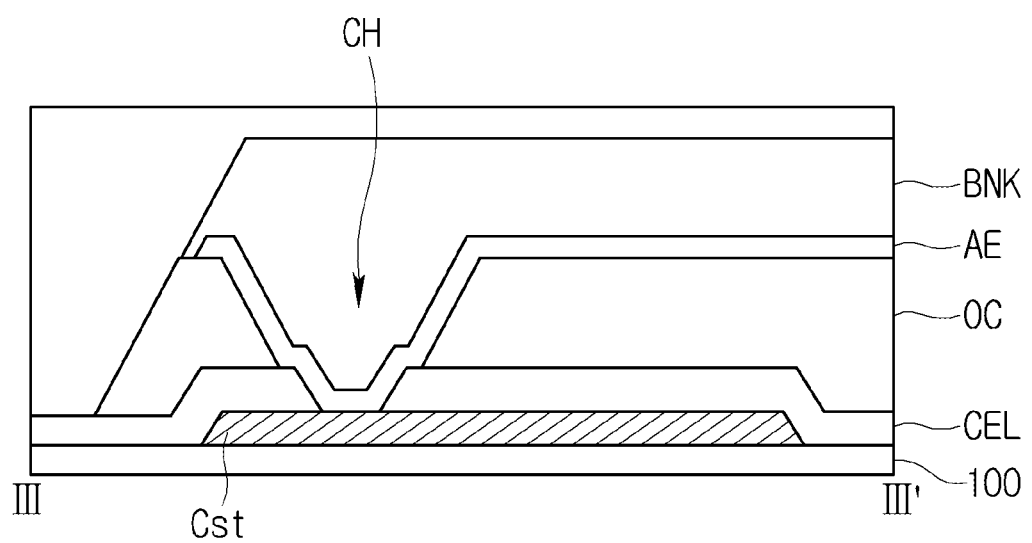
FIG. 10 is a sectional view taken along line of FIG. 9.

Referring to FIGS. 9 and 10, the anode electrode AE has an extension part extending toward the transparent part TA. When the anode electrode AE includes a plurality of anode electrodes, each of the plurality of anode electrodes has an extension part extending toward the transparent part TA, and these extension parts can be coupled with each other.

In addition, the first electrode (for example, a lower electrode) of the capacitor Cst has an extension part extending toward the transparent part TA. The extension part of the anode electrode AE is arranged to overlap the extension part of the capacitor Cst.

The contact hole CH is formed in an area at which the extension part of the anode electrode AE and the extension part of the capacitor Cst overlap each other. The contact hole CH is formed to expose one area of the first electrode of the capacitor Cst. The anode electrode AE can be coupled with the first electrode of the capacitor Cst through the contact hole CH.

The first extension part EXT1 and the second extension part EXT2 may be coupled to a first extension line SEL1 and a second extension line SEL2, respectively, through a first contact hole CH1 and a second contact hole CH2, respectively.

Such a structure may be used to repair pixels PX. In the embodiment, when one of the light emitting parts EA1 and EA2 malfunctions, the drive transistor DT is electrically disconnected from the associated anode electrode. For example, the disconnection can be performed through laser cutting. For an example, a laser is emitted to the extension part of the anode electrode in which defect has occurred so as to perform the laser cutting. In the light emitting parts EA1 and EA2, the anode electrodes operate individually. Accordingly, even if one anode electrode is disconnected from the storage capacitor Cst, another anode electrode can operate normally.

Although the embodiments of the present disclosure have been described above with reference to the accompanying drawings, it will be understood that the technical configuration of the display device of the present disclosure may be embodied in other specific forms by those skilled in the art to which the present disclosure pertains without changing the technical spirit or features of the present disclosure. Therefore, it should be understood that the embodiments described above are illustrative in all respects and not restrictive. In addition, the scope of the present disclosure is indicated by the claims to be described later rather than by the above detailed description. In addition, all changes or modifications derived from the meaning and scope of the claims and their equivalent concepts should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   a pixel part having sub-pixels disposed therein, and
   at least one transparent part disposed in an area adjacent to the pixel part, wherein the at least one transparent part is configured to pass external light therethrough,
   wherein the pixel part includes:
   first, second, third and fourth extension parts extending in directions different from each other, the first, second, third and fourth extension parts each including wires, and
   first, second, third and fourth circuit parts, each of the first, second, third and fourth circuit parts being disposed between a respective adjacent pair of the first, second, third and fourth extension parts and including circuit elements of a respective sub-pixel of the sub-pixels, and
   wherein each of the first, second, third and fourth circuit parts has a three sided shape, the three sided shape including:
   a first side in contact with one of the first, second, third and fourth extension parts adjacent thereto;
   a second side in contact with another of the first, second, third and fourth extension parts adjacent thereto; and
   a third side in contact with the transparent part.

2. The display device of claim 1, wherein
   each of the first, second, third and fourth extension parts has shape symmetrical to others of the first, second, third and fourth extension parts adjacent thereto relative to a first axis and a second axis, the second axis being intersecting with the first axis, and
   each of the first, second, third and fourth circuit parts has shape symmetrical to others of the first, second, third and fourth circuit parts adjacent thereto relative to the first axis and the second axis.

3. The display device of claim 1, wherein a length of the third side is longer than a length of a fourth side, the fourth side being located at a respective extension part of the first, second, third and fourth extension parts and being in contact with the at least one transparent part.

4. The display device of claim 1, wherein distances between each of the first, second, third and fourth extension parts and a center of a respective transparent part adjacent thereto are substantially the same.

5. The display device of claim 1, wherein the at least one transparent part is surrounded in part by the third side of the circuit part and those of the first, second, third and fourth extension parts adjacent to the circuit part.

6. The display device of claim 1, wherein the wires comprise:
   at least one first power line configured to apply a first potential drive voltage to the sub-pixels, and
   at least one second power line configured to apply a second potential drive voltage to the sub-pixels,
   wherein the first potential drive voltage is greater than the second potential drive voltage, wherein each of the at least one first power line and the at least one second power line comprises a first pattern extending along a first axis via each of the first extension part and the third extension part, and at least one of the at least one first power line and the at least one second power line comprises a second pattern extending along a second axis via each of the second extension part and the fourth extension part, the second axis being substantially intersecting with the first axis.

7. The display device of claim 1, wherein the wires comprise:

a first power line configured to apply a first potential drive voltage to the sub-pixels, and a second power line configured to apply a second potential drive voltage to the sub-pixels, wherein the first potential drive voltage is greater than the second potential drive voltage, wherein each of the first power line and the second power line comprises a second pattern extending along a second axis via each of the second extension part and the fourth extension part, and at least one of the first power line and the second power line comprises a first pattern extending along a first axis via each of the first extension part and the third extension part, the first axis being intersecting with the second axis.

8. A display device comprising:

a pixel part having sub-pixels disposed therein, and at least one transparent part disposed in an area adjacent to the pixel part, wherein the at least one transparent part is configured to pass external light therethrough, wherein the pixel part includes:

first, second, third and fourth extension parts extending in directions different from each other, the first, second, third and fourth extension parts each including wires, and first, second, third and fourth circuit parts, each of the first, second, third and fourth circuit parts being disposed between a respective adjacent pair of the first, second, third and fourth extension parts and including circuit elements of a respective sub-pixel of the sub-pixels, wherein each of the sub-pixels includes a light emitting part including a light emitting element, each light emitting part disposed at regions of overlap between a respective circuit part of the first, second, third and fourth circuit parts and a respective adjacent pair of the first, second, third and fourth extension parts.

9. The display device of claim 8, wherein the light emitting part has a three-sided shape having one curved side in contact with the at least one transparent part.

10. The display device of claim 9, wherein the at least one transparent part is surrounded in part by the curved side of the light emitting part.

11. The display device of claim 8, wherein the light emitting part includes:

a first light emitting part, wherein the first light emitting part overlaps a first portion of the respective circuit part corresponding to the light emitting part, and overlaps one extension part of the respective adjacent pair, the one extension part being adjacent to a first side of the respective circuit part, and a second light emitting part, wherein the second light emitting part overlaps a second portion of the respective circuit part, and overlaps the other extension part of the respective adjacent pair, the other extension part being adjacent to a second side of the respective circuit part.

12. A display device comprising:

a pixel part having sub-pixels disposed therein, and at least one transparent part disposed in an area adjacent to the pixel part, wherein the at least one transparent part is configured to pass external light therethrough, wherein the pixel part includes:

first, second, third and fourth extension parts extending in directions different from each other, the first, second, third and fourth extension parts each including wires, and first, second, third and fourth circuit parts, each of the first, second, third and fourth circuit parts being disposed between a respective adjacent pair of the first, second, third and fourth extension parts and including circuit elements of a respective sub-pixel of the sub-pixels, wherein the pixel part comprises:

a substrate having red, green, blue and white sub-pixels disposed thereon;

color filters disposed corresponding to a respective light emitting part of each of the red, green, and blue sub-pixels; and a black matrix disposed between adjacent ones of the color filters, wherein the black matrix is not disposed on the white sub-pixel.

13. A display device comprising:

a display panel having unit pixels disposed thereon, wherein each of the unit pixels includes:

a pixel part having sub-pixels disposed thereon, and at least one transparent part disposed in an area adjacent to the pixel part, the at least one transparent part configured to pass external light therethrough, wherein the pixel part comprises:

first, second, third and fourth extension parts extending in directions different from each other, the first, second, third and fourth extension parts each including wires, and first, second, third and fourth circuit parts, each of the first, second, third and fourth circuit parts being disposed between a respective adjacent pair of the first, second, third and fourth extension parts, the first, second, third and fourth circuit parts including respective circuit elements of each of the sub-pixels, and wherein each of the first, second, third and fourth circuit parts has a three sided shape including:

a first side in contact with one of the first, second, third and fourth extension parts adjacent thereto;

a second side in contact with another of the first, second, third and fourth extension parts adjacent thereto; and a third side in contact with the transparent part.

14. The display device of claim 13, wherein a length of the third side is longer than a length of a fourth side located at each of the first, second, third and fourth extension parts and in contact with a respective transparent part of the at least one transparent part.

15. The display device of claim 14, wherein distances between each of the first, second, third and fourth extension parts and a center of the respective transparent part adjacent thereto are substantially the same.

16. The display device of claim 15, wherein the at least one transparent part is surrounded by four sub-pixels, each of the four sub-pixels belonging to a different unit pixel, the at least one transparent part having edges corresponding to:

third sides of respective circuit parts of the four sub-pixels; and respective extension parts adjacent to the circuit parts.

17. The display device of claim 16, wherein the at least one transparent part has a regular octagonal shape.

18. The display device of claim 14, wherein each of the sub-pixels comprises at least one light emitting part disposed at a region, the region being a region of overlap between a circuit part and an extension part, the at least one light emitting part comprising a light emitting element.

19. The display device of claim 18, wherein the at least one transparent part is surrounded by four sub-pixels, each of the four sub-pixels belonging to a different unit pixel, the at least one transparent part having an edge corresponding to third sides of respective light emitting parts of the four sub-pixels, the at least one transparent part having a circular shape.

20. A display device, comprising:
a transparent part configured to pass external light therethrough; and
a pixel part including:
a first extension part extending in a first direction;
a second extension part extending in a second direction, the second direction being substantially perpendicular to the first direction; and
a circuit part having a three sided shape, the three sided shape including:
a first side adjacent the first extension part;
a second side adjacent the second extension part; and
a third side adjacent the transparent part.

21. The display device of claim 20, wherein the pixel part further includes:
a first light emitting part of a sub-pixel, the first light emitting part overlapping the circuit part and the first extension part; and
a second light emitting part of the sub-pixel, the second light emitting part overlapping the circuit part and the second extension part.

22. The display device of claim 20, wherein the transparent part has regular octagonal shape or circular shape.

* * * * *